United States Patent
Coman et al.

(10) Patent No.: US 6,280,523 B1
(45) Date of Patent: *Aug. 28, 2001

(54) THICKNESS TAILORING OF WAFER BONDED $AL_XGA_YIN_ZN$ STRUCTURES BY LASER MELTING

(75) Inventors: Carrie Carter Coman; Fred A. Kish, Jr.; R. Scott Kern, all of San Jose; Michael R. Krames, Mt View; Paul S. Martin, Pleasanton, all of CA (US)

(73) Assignee: LumiLeds Lighting, U.S., LLC, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/245,448

(22) Filed: Feb. 5, 1999

(51) Int. Cl.$^7$ .................................................... C30B 25/12
(52) U.S. Cl. .......................... 117/101; 117/915; 117/90; 117/95; 117/97
(58) Field of Search ................................ 117/915, 90, 94, 117/97, 101

(56) References Cited

U.S. PATENT DOCUMENTS

| | | | |
|---|---|---|---|
| 5,217,564 | * 6/1993 | Buzler et al. | 117/915 |
| 5,502,316 | * 3/1996 | Kish et al. | 257/94 |
| 5,620,557 | * 4/1997 | Manabe et al. | 117/915 |
| 5,641,381 | * 6/1997 | Barley et al. | 117/915 |
| 5,679,152 | * 10/1997 | Tischler et al. | 117/915 |
| 5,846,844 | * 12/1998 | Akasaki et al. | 117/915 |
| 6,046,465 | 4/2000 | Wang et al. | 257/98 |

FOREIGN PATENT DOCUMENTS

| | | |
|---|---|---|
| 0 860 913 A2 | 8/1998 | (EP) . |
| 0 896 405 A2 | 2/1999 | (EP) . |
| 2 307 791 A | 6/1997 | (GB) . |
| 2 333 895 A | 8/1999 | (GB) . |

OTHER PUBLICATIONS

C. L. Chua et al., "Dielectrically–Bonded Long Wavelength Vertical Cavity Laser on GaAs Substrates Using Strain–Compensated Multiple Quantum Wells", IEEE Photonics Technology Letters, vol. 6. No. 12, Dec. 1994, pp. 1400–1402.

Dubravko I. Babic et al., "Room–Temperature Continuous–Wave Operation of 1.54–μm Vertical–Cavity Lasers", IEEE Photonics Technology Letters, vol. 7, No. 11, Nov. 1995, pp. 1225–1227.

R. K. Sink et al., "Cleaved GaN facets by wafer fusion of GaN to InP", Appl. Phys. Lett. 68 (15), Apr. 8, 1996, pp. 2147–2149.

P. D. Floyd et al., "Wafer Fusion of Infrared Laser Diodes to GaN Light–Emitting Heterostructures", IEEE Photonics Technology Letters, vol. 10, No. 11, Nov. 1998, pp. 1539–1541.

(List continued on next page.)

*Primary Examiner*—Robert Kunemund
(74) *Attorney, Agent, or Firm*—Skjerven Morrill MacPherson LLP; Brian D. Ogonowsky; Rachel V. Leiterman

(57) ABSTRACT

Light emitting devices having a vertical optical path, e.g. a vertical cavity surface emitting laser or a resonant cavity light emitting or detecting device, having high quality mirrors may be achieved using wafer bonding or metallic soldering techniques. The light emitting region interposes one or two reflector stacks containing dielectric distributed Bragg reflectors (DBRs). The dielectric DBRs may be deposited or attached to the light emitting device. A host substrate of GaP, GaAs, InP, or Si is attached to one of the dielectric DBRs. Electrical contacts are added to the light emitting device.

18 Claims, 8 Drawing Sheets

OTHER PUBLICATIONS

J. J. Dudley et al., "Low threshold, wafer fused long wavelength vertical cavity lasers", Department of Electrical and Computer Engineering, University of California, Santa Barbara, CA 93106, Aug. 2, 1993, pp. 1463–1465.

J. J. Dudley et al., "144 °C operation of 1.3 $\mu$m InGaAsP vertical cavity lasers on GaAs substrates", Electrical and Computer Engineering Department, University of California, Santa Barbara, CA 93106.

* cited by examiner

THICKNESS TAILORING OF WAFER BONDED $AL_xGA_yIN_zN$ STRUCTURES BY LASER MELTING

STATEMENT AS TO RIGHTS UNDER FEDERALLY SPONSORED RESEARCH AND DEVELOPMENT

This invention was made with government support under Agreement Number MDA972-96-3-0014 awarded by the Defense Advanced Research Projects Agency (DARPA). The Federal Government has certain rights to this invention.

FIELD OF INVENTION

The invention is directed towards the field of light emission particularly towards providing high quality reflective surfaces to both sides of an $Al_xGa_yIn_zN$ device,

BACKGROUND

A vertical cavity optoelectronic structure consists of an active region that is formed by light emitting layer interposing confining layers that may be doped, un-doped, or contain a p-n junction. The structure also contains at least one reflective mirror that forms a Fabry-Perot cavity in the direction normal to the light emitting layers. Fabricating a vertical cavity optoelectronic structure in the $GaN/Al_xGa_yIn_zN/Al_xGa_{1-x}N$ (where x+y+z=1 in $Al_xGa_yIn_zN$ and where $x \leq 1$ in $Al_xGa_{1-x}N$) material systems poses challenges that set it apart from other III–V material systems. It is difficult to grow $Al_xGa_yIn_zN$ structures with high optical quality. Current spreading is a major concern for $Al_xGa_yIn_zN$ devices. Lateral current spreading in the p-type material is ~30 times less than that in the n-type material. Furthermore, the low thermal conductivity of many of the substrates adds complexity to the device design, since the devices should be mounted junction down for optimal heat sinking.

One vertical cavity optoelectronic structure, e.g. a vertical cavity surface emitting laser (VCSEL), requires high quality mirrors, e.g. 99.5% reflectivity. One method to achieve high quality mirrors is through semiconductor growth techniques. To reach the high reflectivity required of distributed Bragg reflectors (DBRs) suitable for VCSELs (>99%), there are serious material issues for the growth of semiconductor $Al_xGa_yIn_zN$ DBRs, including cracking and electrical conductivity. These mirrors require many periods/layers of alternating indium aluminum gallium nitride compositions $(Al_xGa_yIn_zN/Al_xGa_{y'z}In_zN)$. Dielectric DBRs (D-DBR), in contrast to semiconductor DBRs, are relatively straightforward to make with reflectivities in excess of 99% in the spectral range spanned by the $Al_xGa_yIn_zN$ system. These mirrors are typically deposited by evaporation or sputter techniques, but MBE (molecular beam epitaxial) and MOCVD (metal-organic chemical vapor deposition) can also be employed. However, only one side of the active region can be accessed for D-DBR deposition unless the growth substrate is removed. Producing an $Al_xGa_yIn_zN$ vertical cavity optoelectronic structure would be significantly easier if it was possible to bond and/or deposit D-DBRs on both sides of a $Al_xGa_yIn_zN$ active region.

Wafer bonding can be divided into two basic categories: direct wafer bonding, and metallic wafer bonding. In direct wafer bonding, the two wafers are fused together via mass transport at the bonding interface. Direct wafer bonding can be performed between any combination of semiconductor, oxide, and dielectric materials. It is usually done at high temperature (>400° C.) and under uniaxial pressure. One suitable direct wafer bonding technique is described by Kish, et al., in U.S. Pat. No. 5,502,316. In metallic wafer bonding, a metallic layer is deposited between the two bonding substrates to cause them to adhere. One example of metallic bonding, disclosed by Yablonovitch, et al. in Applied Physics Letters, vol. 56, pp. 2419–2421, 1990, is flip-chip bonding, a technique used in the micro- and opto-electronics industry to attach a device upside down onto a substrate. Since flip-chip bonding is used to improve the heat sinking of a device, removal of the substrate depends upon the device structure and conventionally the only requirements of the metallic bonding layer are that it be electrically conductive and mechanically robust.

In "Low threshold, wafer fused long wavelength vertical cavity lasers", Applied Physics Letters, Vol. 64, No. 12, 1994, pp1463–1465, Dudley, et al. taught direct wafer bonding of AlAs/GaAs semiconductor DBRs to one side of a vertical cavity structure while in "Room-Temperature Continuous-Wave Operation of 1.54-μm Vertical-Cavity Lasers," IEEE Photonics Technology Letters, Vol. 7, No. 11, November 1995, Babic, et al. taught direct wafer bonded semiconductor DBRs to both sides of an InGaAsP VCSEL to use the large refractive index variations between AlAs/GaAs. As will be described, wafer bonding D-DBRs to $Al_xGa_yIn_zN$ is significantly more complicated than semiconductor to semiconductor wafer bonding, and was not known previously in the art.

In "Dielectrically-Bonded Long Wavelength Vertical Cavity Laser on GaAs Substrates Using Strain-Compensated Multiple Quantum Wells," IEEE Photonics Technology Letters, Vol. 5, No. 12, December 1994, Chua et al. disclosed AlAs/GaAs semiconductor DBRs attached to an InGaAsP laser by means of a spin-on glass layer. Spin-on glass is not a suitable material for bonding in a VCSEL between the active layers and the DBR because it is difficult to control the precise thickness of spin on glass, and hence the critical layer control needed for a VCSEL cavity is lost. Furthermore, the properties of the glass may be inhomogeneous, causing scattering and other losses in the cavity.

Optical mirror growth of $Al_xGa_{1-x}N/GaN$ pairs of semiconductor DBR mirrors with reflectivities adequate for VCSELs, e.g. >99%, is difficult. Referring to FIG. 1, theoretical calculations of reflectivity suggest that to achieve the required high reflectivity, a high index contrast is required that can only be provided by increasing the Al composition of the low-index $Al_xGa_{1-x}N$ layer and/or by including more layer periods (material properties taken from Ambacher et al., MRS Internet Journal of Nitride Semiconductor Research, 2(22) 1997). Either of these approaches introduces serious challenges. If current will be conducted through the DBR layers, it is important that the DBRs be conductive. To be sufficiently conductive, the $Al_xGa_{1-x}N$ layer must be adequately doped. Electrical conductivity is insufficient unless the Al composition is reduced to below approximately 50% for Si (n-type) doping and to below approximately 20% for Mg (p-type) doping. However, as shown in FIG. 1, the number of layer periods needed to achieve sufficient reflectivity using lower Al composition layers requires a large total thickness of $Al_xGa_{1-x}N$ material, increasing the risk of epitaxial layer cracking (due to the relatively large lattice mismatch between AlN and GaN) and reducing compositional control. Indeed, the $Al_{0.30}Ga_{0.70}N$/GaN stack of FIG. 1 is already ~2.5 μm thick and is far from sufficiently reflective for a VCSEL. Thus, a high reflectivity DBR based on this layer pair requires a total thickness significantly greater than 2.5 μm and would be difficult to grow reliably given the mismatch between AlN and GaN growth conditions and material properties. Even though the cracking is not as great of an issue if the layers are un-doped, compositional control and the AlN/GaN growth temperatures still pose great challenges to growing high reflectivity DBRs. Hence, even in applications where the DBRs do not have to conduct current, semiconductor mirror stacks with reflectivities >99% in the $Al_xGa_yIn_zN$ material system have not been demonstrated. For this reason, dielectric-based DBR mirrors are preferred.

SUMMARY

At least one mirror stack, e.g. a dielectric distributed Bragg reflector (D-DBR) or composite D-DBR/semiconductor DBR interposes a $Al_xGa_yIn_zN$ active region and a host substrate. A wafer bond interface is positioned somewhere between the host substrate and the active region. An optional intermediate bonding layer is adjacent the wafer bond interface to accommodate strain and thermal coefficient mismatch at the wafer bond interface. An optional mirror stack is positioned adjacent the $Al_xGa_yIn_zN$ active region. Either the host substrate or intermediate bonding layer is selected for compliancy.

One embodiment of the aforementioned invention consists of a device having the wafer bond interface positioned adjacent the $Al_xGa_yIn_zN$ active region, the $Al_xGa_yIn_zN$ active region is fabricated on a sacrificial substrate, e.g. $Al_2O_3$. The mirror stack attached to a host substrate is direct wafer bonded to the $Al_xGa_yIn_zN$ active region. Next, the sacrificial substrate is removed. The optional mirror stack is attached to the top of the $Al_xGa_yIn_zN$ active region. Techniques for attaching include bonding, depositing, and growing. Electrical contacts are added to the n-type and p-type layers.

For an alternate embodiment having the wafer bond interface positioned adjacent the host substrate, the mirror stack is attached on top of the $Al_xGa_yIn_zN$ active region. If direct wafer bonding is employed, a host substrate, selected to have the proper mechanical properties, is wafer bonded to the mirror stack. Alternatively, metallic bonding may be used to bond the host substrate to the mirror stack. The sacrificial substrate is removed. An optional mirror stack is attached on top of the $Al_xGa_yIn_zN$ active region. Electrical contacts are added to the n-type and p-type layers. Selection of the host substrate in cases of direct wafer bonding to obtain the desired properties is a critical teaching. Additional embodiments include positioning the wafer bond interface within the DBR.

DETAILED DESCRIPTION OF THE DRAWINGS

Dielectric distributed Bragg reflectors (D-DBR) consist of stacked pairs of low loss dielectrics where one of the pair materials has a low index of refraction and one has a high index of refraction. Some possible dielectric DBR mirrors are based on paired layers of silicon dioxide ($SiO_2$) with titanium oxide ($TiO_2$), zirconium oxide ($ZrO_2$), tantalum oxide ($Ta_2O_5$), or hafnium oxide ($HfO_2$) can achieve the high reflectivities required for a blue vertical cavity surface emitting laser (VCSEL) e.g. >99.5%, or resonant cavity light emitting device (RCLED), e.g. 60% or higher. The $SiO2$/$HfO2$ stacked pairs are of special interest since they can be used to produce mirror stacks with reflectivities in excess of 99% in the wavelength range of 350–500 nm. D-DBRs made with alternating layers of $SiO_2$ and $HfO_2$ have been shown to be mechanically stable up to 1050° C., lending flexibility to subsequent processing.

Figure 1:
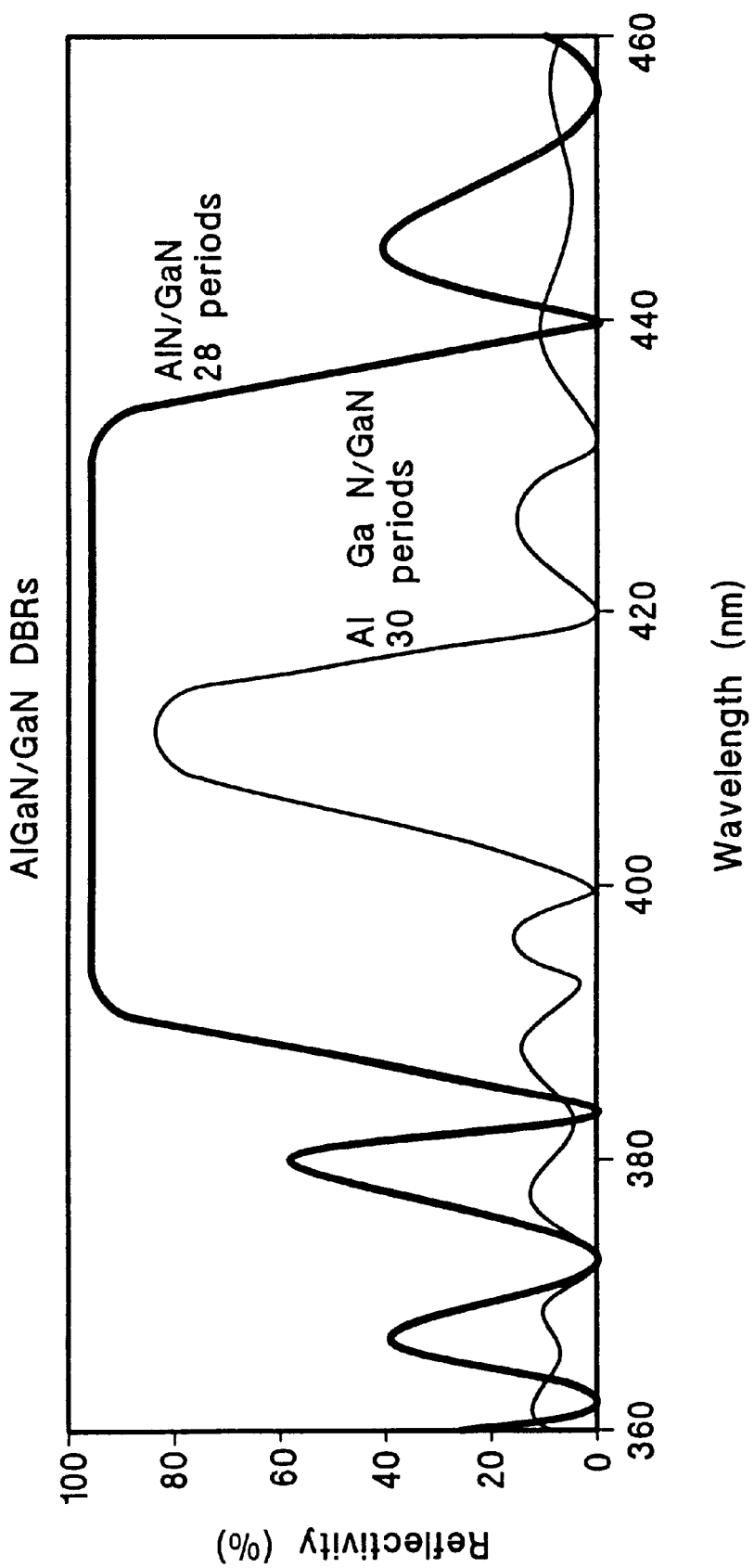
FIG. 1 illustrates the theoretical reflectivity vs. wavelength for AlN/GaN and $Al_{0.30}Ga_{0.70}N$/GaN DBRS.
Figure 2:
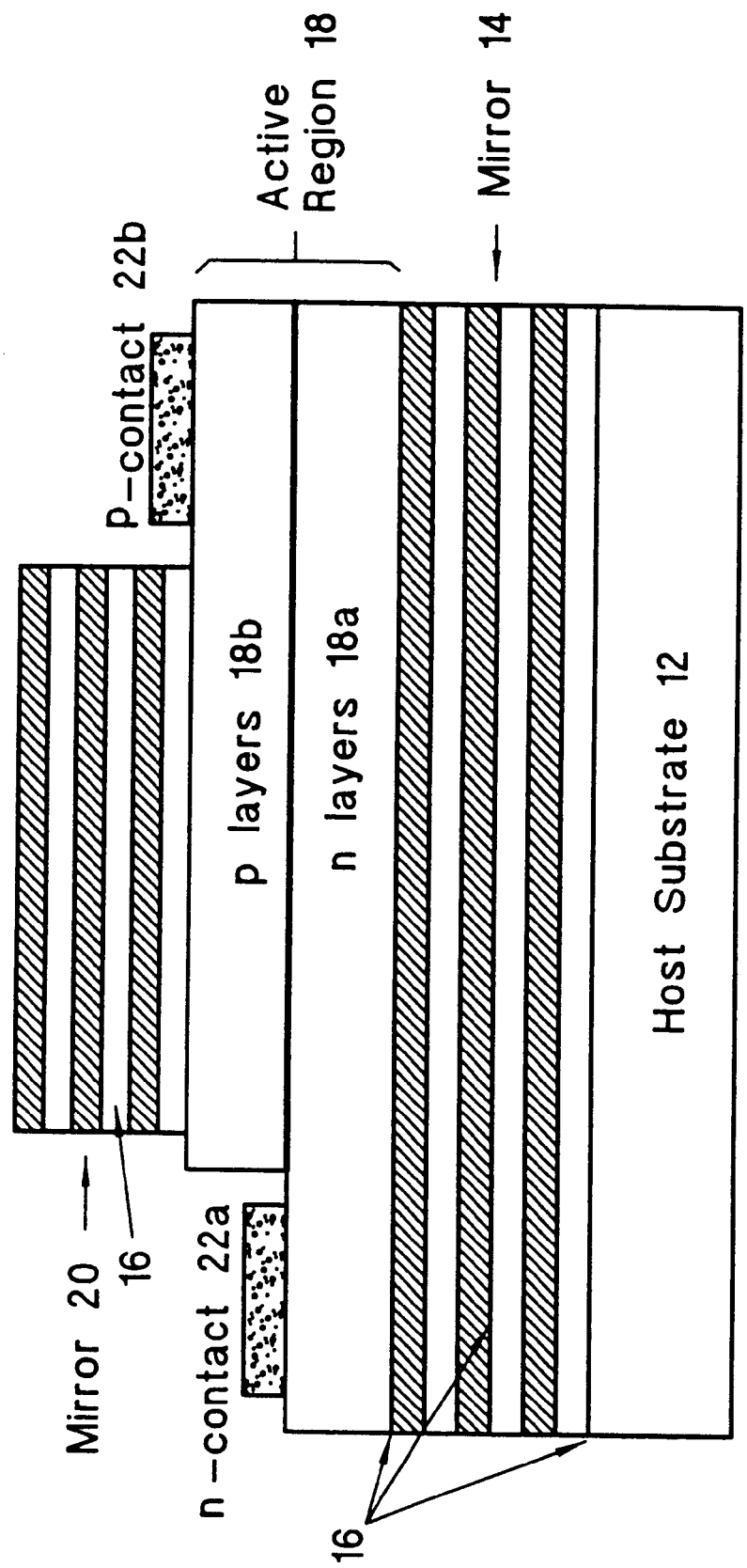
FIG. 2 illustrates a preferred embodiment of the present invention.

A preferred embodiments is shown in FIG. 2. In FIG. 2, a first mirror stack 14, e.g. a DBR of high reflectivity, is attached to a suitable substrate 12. The mirror stack 14 can consist of one or more of the following materials: dielectric, semiconductor and metal. The first mirror stack 14 is wafer-bonded to a top p-layer 18b in an $Al_xGa_yIn_zN$ active region 18 grown on a sacrificial substrate. The $Al_xGa_yIn_zN$ vertical cavity optoelectronic structure 18 has been designed for high gain at the desired wavelength. The wafer bonded interface 16 must be of excellent optical quality with very low scattering. The wafer bonded interface 16 may include an optional intermediate bonding layer (not shown). An optional second mirror stack 20, e.g. a D-DBR (shown in FIG. 2), is attached to the $Al_xGa_yIn_zN$ vertical cavity optoelectronic structure 18 on a side opposing the first mirror stack. The optional second mirror stack 20 and n- and p-type layers of the $Al_xGa_yIn_zN$ active region 18a, 18b may be patterned and etched to provide areas for ohmic contacts. For a VCSEL, the mirror must have very high reflectivity >99%. For an RCLED, the reflectivity requirement of the mirror(s) is relaxed (>60%).

An alternate approach, shown in FIG. 2, is for the mirror stack 14 to be attached to the $Al_xGa_yIn_zN$ active region 18. The wafer bond interface 16 is then between the mirror stack 14 and the host substrate 12. This structure may also have an optional second mirror stack 20. Yet another approach, to be used in conjunction with either of the first two, is to have a direct wafer bond in the middle of one or both of the mirror stacks. Several possible locations of a wafer bonded interface 16 are shown in FIG. 2.

Current constriction may be achieved in either the n-type or p-type active region material by inserting an $Al_xGa_yIn_zN$ layer that may be etched and/or oxidized to improve current and optical confinement and thus reduce lasing threshold or improve device efficiency. Incorporation of such a layer is important when a D-DBR and/or un-doped semiconductor DBR is used since no current is conducted through them. The cavity may be a single or multiple-wavelength cavity depending on the required thickness of the contacting layers to obtain a suitably low forward voltage. Many variations on the structures described above are possible. A similar structure can also be produced with the p- and n-type materials switched.

Figure 4A:
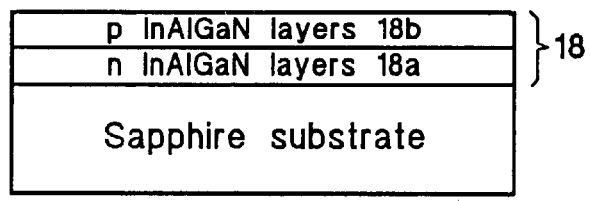
FIGS. 4A–F pictorially depict an alternate flow chart corresponding to the present invention.
Figure 4B:
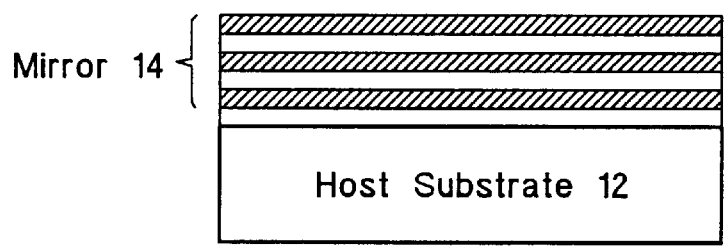
Figure 4C:
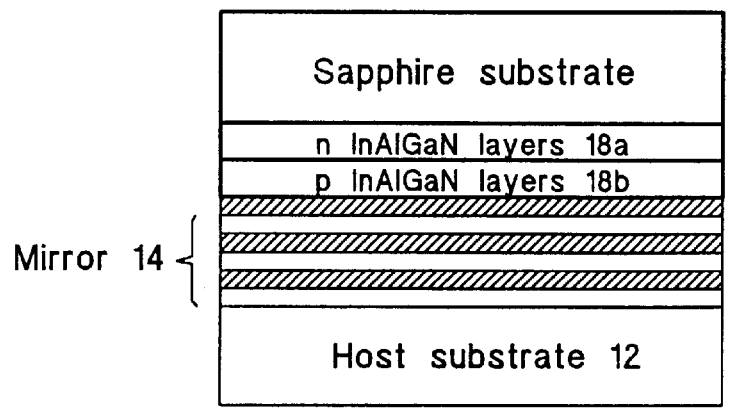
Figure 4D:
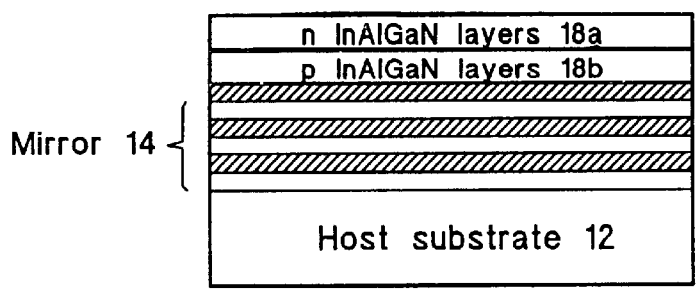
Figure 4E:
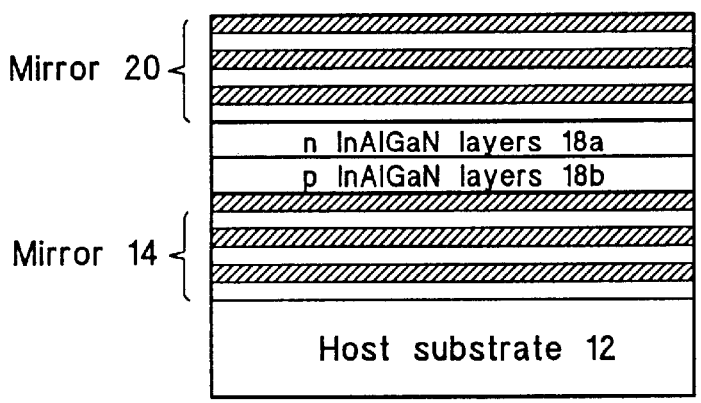
Figure 4F:
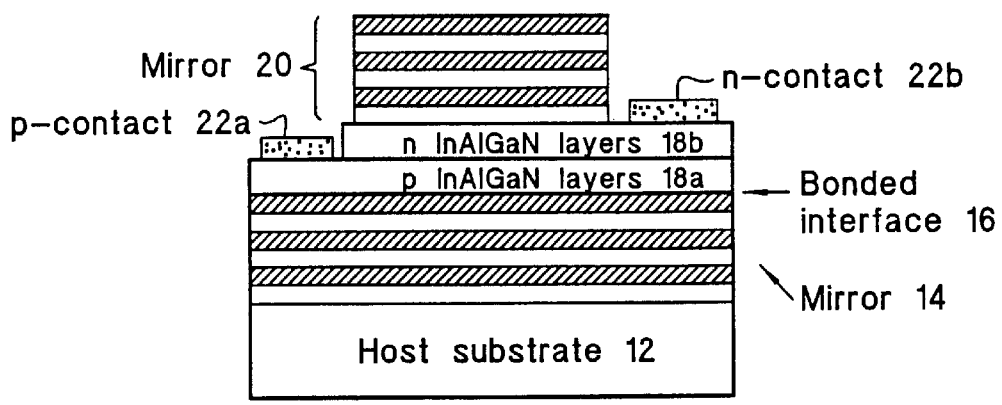

FIGS. 4A–4F pictorially depict a flow chart corresponding to an embodiment of the present invention. In FIG. 4A, an $Al_xGa_yIn_zN$ active region is fabricated on a sacrificial substrate, e.g. $Al_2O_3$. In FIG. 4B, a first mirror stack is attached to a host substrate. Techniques for attaching include bonding, depositing, and growing. In FIG. 4C, the first mirror stack is attached via wafer bonding to the $Al_xGa_yIn_zN$ active region. For a VCSEL, direct wafer bonding should be used since it is critical to have low optical losses. In FIG. 4D, the sacrificial substrate is removed. In FIG. 4E, the optional second mirror stack is attached to the top of the $Al_xGa_yIn_zN$ active region. In FIG. 4F, electrical contacts are added to the optional second mirror stack or $Al_xGa_yIn_zN$ active region. Patterning to define the device area and to expose the contact layers can also be performed in the process flow.

Figure 3A:
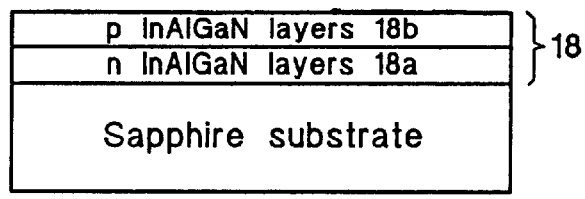
FIGS. 3A–F pictorially depict the flow chart corresponding to the present invention.
Figure 3B:
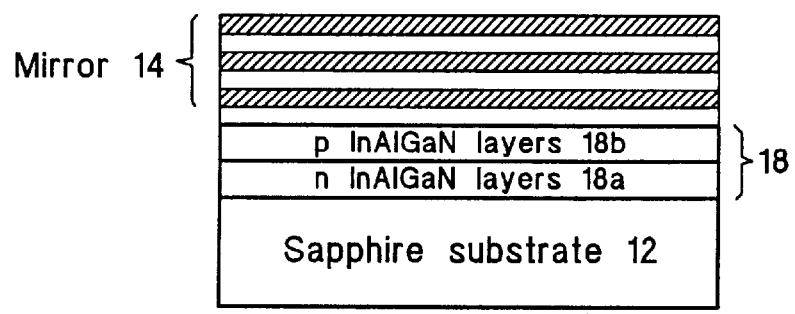
Figure 3C:
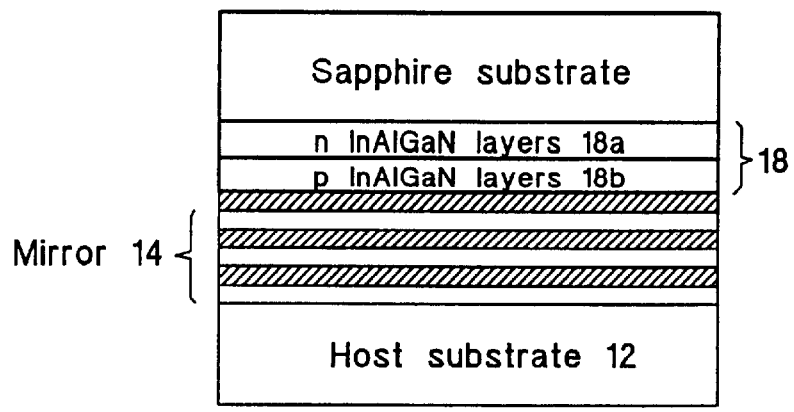
Figure 3D:
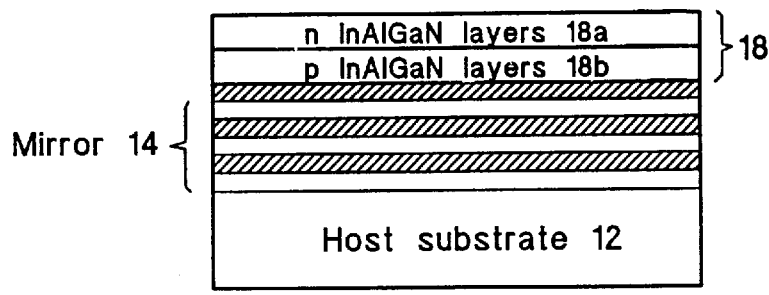
Figure 3E:
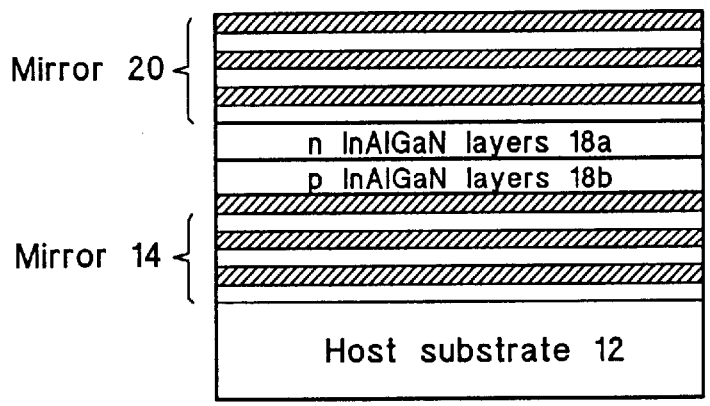
Figure 3F:
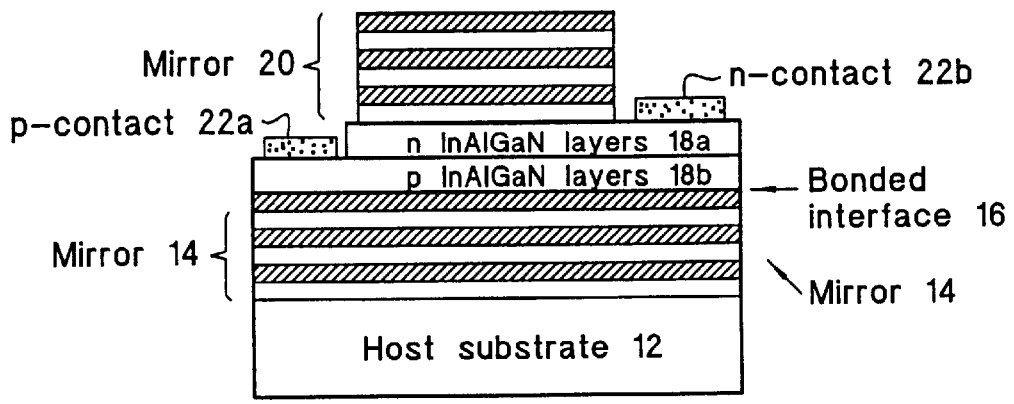

FIG. 3A–3F pictorially depict an alternate process flowchart. In FIG. 3A, a $Al_xGa_yIn_zN$ active region is grown over on a sacrificial substrate. In FIG. 3B, the first mirror stack is attached to the $Al_xGa_yIn_zN$ active region. In FIG. 3C, a host substrate is attached via direct wafer bonding or metallic bonding to the first mirror stack. Since the wafer bond is outside of the optical cavity, losses due to the wafer bond are less critical. In FIG. 3D, the sacrificial substrate is removed. In FIG. 3E, the optional second mirror stack is attached to the $Al_xGa_yIn_zN$ active region. In FIG. 3F, electrical contacts are added to the optional second mirror stack or $Al_xGa_yIn_zN$ active region. Patterning to define the device area and to expose the contact layers can also be performed in the process flow.

The choice of host substrate for direct wafer bonding is critical and is effected by several properties: mass transport, compliancy, and stress/strain relief. The host substrate can be selected from a group that includes gallium phosphide (GaP), gallium arsenide (GaAs), indium phosphide (InP), or silicon (Si). For Si, the preferred thickness of the substrate is between 1000 Å and 50 µm.

Mass transport plays an important role in direct wafer bonding. In standard III–V to III–V direct wafer bonding, or III–V to dielectric bonding, at least one surface exhibits significant mass transport at temperatures sufficiently low to preserve the quality of the layers. In contrast, $Al_xGa_yIn_zN$ and most dielectric materials do not exhibit significant mass transport at temperatures consistent with maintaining integrity of the high-In containing $Al_xGa_yIn_zN$ active layers (<1000° C.). Lack of mass transport in one or both of the bonding materials impedes wafer adhesion. A model for this is that when both materials exhibit significant mass transport at the bonding temperature, the bonds of both materials can rearrange into the strongest bond across the interface. When only one material exhibits significant mass transport, the bonds of only this one material can align with the surface bonds of the other material. It is difficult in this situation to form a wafer bond of high mechanical strength.

Compliancy is the ability of the material to change shape on an atomic or macroscopic scale to accommodate strains and stresses. For the purposes of this invention, compliancy is defined to be accomplished by materials that have a melting point less than the bonding temperature, or when materials have a ductile/brittle transition below the bonding temperature, or when the substrates are thinner than ~50 µm.

Standard III–V wafer bonding for substrates of GaP, GaAs, and InP is generally performed at temperatures of 400–1000° C. where both substrates are compliant. Compliancy of at least one of the bonding materials is essential to wafer bonding since the materials have inherent surface roughness and/or lack of planarity on either and microscopic or macroscopic scale. At a temperature of 1000° C. a $Al_xGa_yIn_zN$ structure annealed in an $N_2$ ambient for 20 minutes results in a reduction of PL intensity of approximately 20%. Thus it is desirable to keep the bonding temperature below 1000° C. GaN-based materials grown on $Al_2O_3$ substrates are not compliant at bonding temperatures below 1000° C. Dielectric materials that are used to make high reflectivity D-DBRs for wide band-gap semiconductors are typically not compliant below 1000° C. Hence, it is important that the bonding/support substrate and/or intermediate bonding be compliant at those temperatures.

Melting point is one property that determines the compliancy of materials. For example, for the following materials, GaAs ($T_m$=1510K), GaP ($T_m$=1750K), and InP ($T_m$=1330K), it can be seen that the relative order of compliancy is InP, GaAs, GaP, with InP being the most compliant. Materials generally undergo a ductile/brittle transition below the melting point. The compliancy of these materials at high temperatures has to be balanced with desorption of one of the elements. Even though InP is compliant at 1000° C., the material would be severely decomposed at that temperature because of the desorption of phosphorus. Bonding with such materials should be limited to temperatures less than approximately two times the desorption temperature at the ambient pressure during bonding. Thus, the selection of materials must be compatible both with the required compliancy and the bonding temperature.

Very thin substrates can also be compliant. Thin silicon, e.g. <50 µm, is compliant because, even at a high radius of curvature, the stresses are small if the substrate is thin. This technique works well for materials having a high fracture hardness, e.g. silicon (11270 N/mm$^2$) or $Al_xGa_yIn_zN$. However, materials that have a low fracture hardness, e.g. GaAs (2500 N/mm$^2$) can easily fracture upon handling. For silicon having a thickness >50 µm, even a small radius of curvature causes high stresses in the material, causing the material to fracture. The same applies to other materials that are potential substrate candidates.

Stress and strain relief is exacerbated by the high mismatch strain in GaN grown on $Al_2O_3$ as well as the coefficient of thermal expansion (CTE) mismatch between $Al_xGa_yIn_zN$ and most other suitable support substrate materials. In contrast to other semiconductor materials that are wafer bonded, the CTE mismatch between $Al_xGa_yIn_zN$ and other semiconductor materials is greater; the stresses are compounded by the different CTE mismatch along the a and c planes of the wurzite material. The stresses in GaN (CTE= 5.59, a-plane/3.17×10$^{-6}$, c-plane/° C.) wafer bonded to a different substrate (GaAs CTE=5.8, GaP CTE=6.8, InP= 4.5×10$^{-6}$/C) necessitates local stress relief since the CTE mismatch of the host substrate should closely match those of both GaN planes. This stress can be accommodated in a compliant material, in an intermediate bonding layer that is soft or a liquid at the bonding interface at the bonding temperature, or by providing local strain relief, e.g. patterning at least one of the bonded interfaces. The intermediate bonding layer is selected from a group that includes dielectrics and alloys containing halides (e.g. $CaF_2$), ZnO, indium (In), tin (Sn), chrome (Cr), gold (Au), nickel (Ni), copper (Cu), and II–VI materials.

Current spreading is another major concern for GaN-based devices. Lateral current spreading in the p-type material is ~30× less than that in the n-type material. While fabricating high reflectivity mirrors on both sides of the active layer is necessary for a good cavity, the problem of lateral p-layer current spreading is exacerbated because of the insulating nature of the D-DBRs. One way to improve the current spreading in the p-layer is to make a composite DBR of conductive transparent semiconductor and dielectric stacks. The semiconductor part of the stack improves current spreading by adding thickness to the p-layers while the dielectric stack improves the low semiconductor reflectivity to bring the total mirror reflectivity above 99%. This same procedure could be applied to the n-type mirror, though it is less crucial because of the higher conductivity of the n-type layers.

The addition of current constriction layers would further improve current spreading by directing the current only into the cavity, and may be necessary for a VCSEL. This can be applied to the vertical cavity optoelectronic structure with or without a composite semiconductor/dielectric DBR, and may be incorporated into the semiconductor part of a composite mirror. Although the current constriction layers may be included in both the p- and n-layers of the confining layers, it is most effective in the p-confining layers because of the lower conductivity.

The support substrate is necessary if a D-DBR is to be attached to both sides of the active region, since the original host substrate must be removed. There are several methods for removing the sapphire substrate, which is typically employed as a growth substrate. The methods outlined below are only a subset of the techniques that could be used to remove the growth substrate, which can also be a material other than sapphire.

In laser melting, a technique as disclosed by Wong, et al, and Kelley, et al., having a laser with a wavelength for which the sapphire substrate is transparent but the semiconductor layer adjacent the substrate is not, illuminates the back (sapphire side) of the structure. The laser energy cannot penetrate the adjacent semiconductor layer. If the laser energy is sufficient, the semiconductor layer adjacent the sapphire substrate heats to the point that it decomposes. For the case where GaN is the layer adjacent the sapphire substrate, the layer at the interface decomposes into Ga and N, leaving Ga behind at the interface. The Ga metal is then melted and the sapphire substrate is removed from the rest of the layer structure. The decomposition of the layer adjacent the sapphire substrate depends on laser energy, wavelength, material decomposition temperature, and the absorption of the material. The sapphire substrate may be removed by this technique to allow a D-DBR to be attached to the other side of the active region. However, it is critical that the VCSEL interfaces be minimally lossy (<0.5%) and very smooth to maximize cavity resonance characteristics. This laser melting technique has many design variables that may make the laser interface lack the flatness necessary for a VCSEL. Additionally, VCSELs have very tight thickness constraints. There are several ways that laser melting can be used to alleviate both of these problems.

The layer adjacent the sacrificial growth substrate is defined to be a sacrificial layer if the thickness of the layer is such that it will be completely decomposed by the laser. Published results in the literature (Wong, et al.) indicate that a layer thickness that will be completely decomposed is approximately 500 Å, but this value will be dependent on the laser energy, the laser wavelength, and material decomposition temperature and the absorption of the layer adjacent the substrate. The layer adjacent the sacrificial layer (opposite the substrate), the stopper layer, is chosen to have a higher decomposition temperature or lower absorption at the laser wavelength than sacrificial layer. The stopper layer, because it has a higher decomposition temperature or low absorption, will not be significantly affected by the laser energy. In this structure, the sacrificial layer is decomposed by the laser, leaving an abrupt interface at the stopper layer which has a higher decomposition temperature or lower absorption. That stopper layer can also then be subsequently etched, oxidized and etched, or decomposed using a laser with different energy and wavelength.

The preferred layer combinations are $GaN/Al_xGa_{1-x}N$, $InGaN/Al_xGa_{1-x}N$, and InGaN/GaN. In the case of $GaN/Al_xGa_{1-x}N$ combination, the GaN sacrificial layer will decompose with the laser but the $Al_xGa_{1-x}N$ stopper layer will be unaffected. The $Al_xGa_{1-x}N$ can then be etched away using selective wet chemical etching to stop on a smooth $Al_xGa_yIn_zN$ interface. Alternatively, if the GaN layer described above is not completely decomposed, the remaining GaN can be etched away. Since a thick buffer layer is needed at the beginning of GaN growth and the VCSEL layer interfaces need to be of controlled thickness and very smooth, this technique can be especially valuable.

The thickness of a particular layer or cavity can be tailored by using one or more sacrificial layers and stopper layers. By laser melting and selective wet chemical etching, layer pairs can be decomposed and etched in sequence until the desire thickness is reached. A preferred layer combination is $GaN/Al_xGa_{1-x}N$ where the GaN is the sacrificial layer and the $Al_xGa_{1-x}N$ stopper layer can be selectively wet chemical etched.

There are other alternative methods of removing the growth substrate. One method is to use AlN which can be selectively etched using wet chemical etching. AlN may be used as a sacrificial layer where the $Al_xGa_yIn_zN$ layers can be removed from the host substrate by using AlN selective etching to undercut the structure. Alternatively, the AlN layers can be oxidized using a wet oxidation process at elevated temperatures. The AlN-oxide can then be etched away using an etchant, e.g. HF. In another approach, the substrate may be exfoliated, e.g. implanted with a light ion into the material. This creates defects at a certain depth. When the substrate is heated, the material selectively cleaves through the dislocations and the substrate is separated from the active layers. Undercutting a ZnO or other dielectric buffer layer via chemical etchants can also be used to remove the substrate from the $Al_xGa_yIn_zN$ layers. This technique can be applied to 2-D or 3-D growth techniques (e.g. $SiO_2$ or other dielectric used in ELOG) where the $Al_xGa_yIn_zN$ layer is continuous across the substrate or in patterned areas only.

Figure 5:
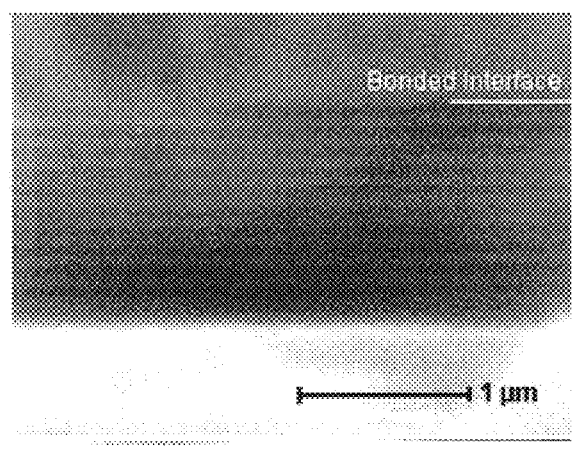
FIG. 5 shows a scanning electron microscope (SEM) cross sectional images of the direct wafer bonded interface between a D-DBR deposited on a GaN/$Al_2O_3$ structure and a GaP host substrate.
Figure 6:
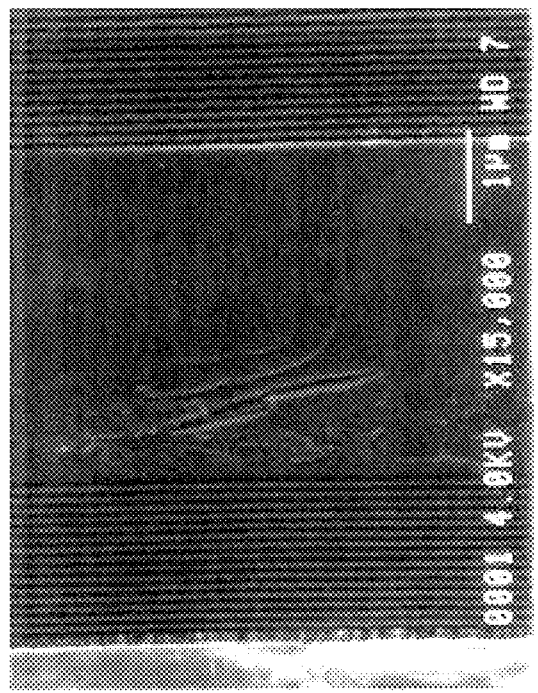
FIG. 6 shows a SEM cross section of an active region with a deposited D-DBR which was metallic bonded to a host substrate. The substrate has been removed and a second D-DBR deposited on the side of the $Al_xGa_yIn_zN$ active region opposite the first D-DBR.
Figure 7:
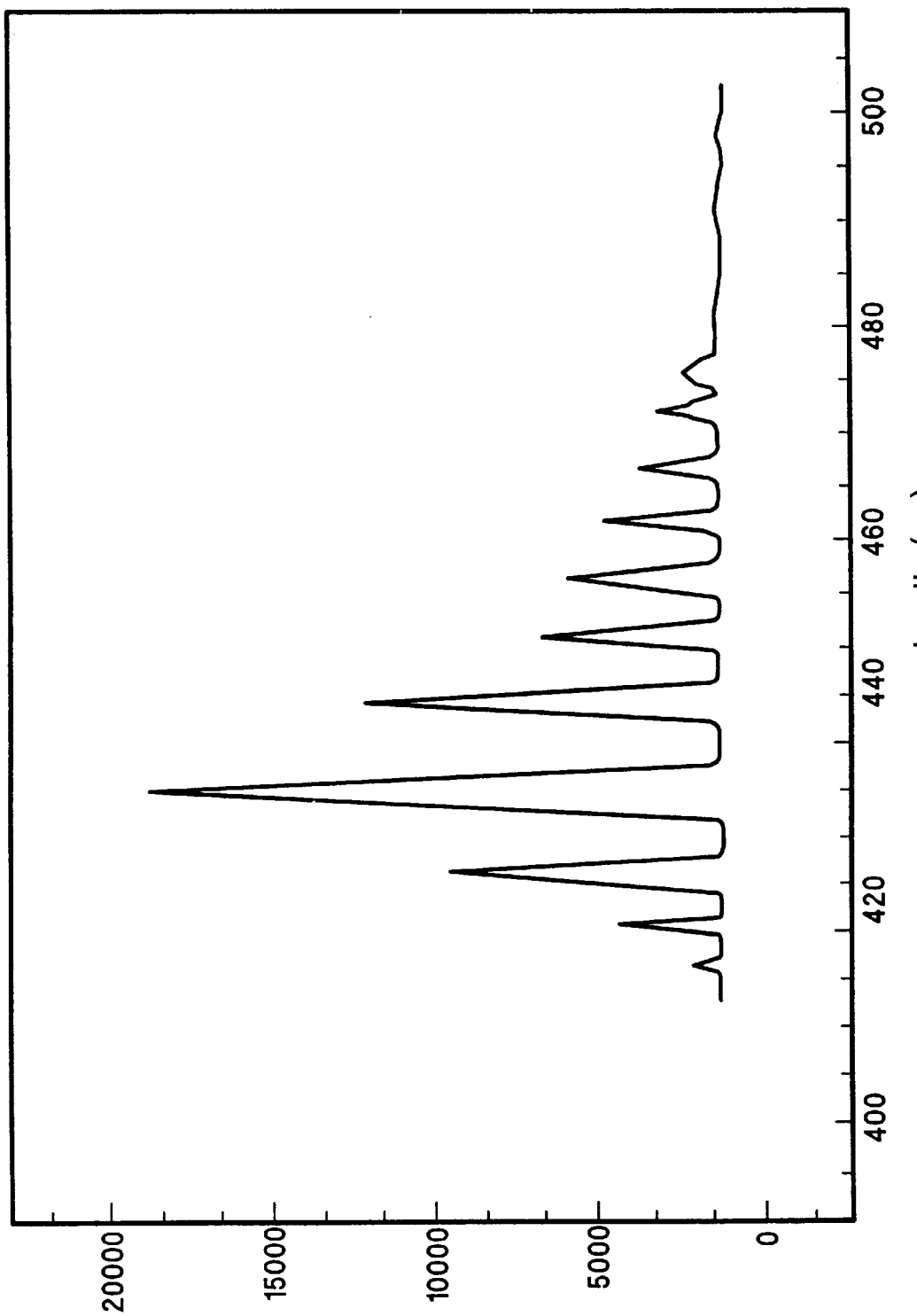
FIG. 7 shows the optical emission spectrum from 400–500 nm from the device in described in FIG. 6. The modal peaks describe a vertical cavity structure.

Dielectric DBRs have been deposited on $Al_xGa_yIn_zN$ active regions grown on sapphire substrates. The DBR/$Al_xGa_yIn_zN$ active region structure was then wafer bonded to a host substrate. In case 1, the DBR/$Al_xGa_yIn_zN$ active region structure was direct wafer bonded to a GaP host substrate (see FIG. 3C). In case 2, the DBR/$Al_xGa_yIn_zN$ active region structure was wafer bonded to a GaP host substrate via an intermediate $CaF_2$ layer (FIG. 3C, where the intermediate layer is not shown). In case 3, the D-DBR was deposited on a host substrate for example, a GaP substrate (see FIG. 4B); for example, a GaP substrate and direct wafer bonded to a $Al_xGa_yIn_zN$ active region (see FIG. 4C). For cases 1 and 3, the bonded area was much smaller than case 2 since no intermediate layer was used. FIG. 5 shows scanning electron microscope (SEM) cross sectional images of the bonded interface for a case 1 structure. The interface is smooth and there are no voids visible at this magnification. In case 4, the DBR/$Al_xGa_yIn_zN$ active region structure was bonded to a host substrate via a metallic intermediate layer consisting of a CrAuNiCu alloy. FIG. 6 shows a SEM cross section of case 4, the sapphire substrate as been removed and a second D-DBR deposited on the side of the $Al_xGa_yIn_zN$ active region opposite the first D-DBR. For all the devices, D-DBR stacks were $SiO_2/HfO_2$, and the sapphire substrate was removed using the laser melting technique. FIG. 7 shows the optical emission spectrum from 400–500 nm from the device in described in FIG. 6. The modal peaks are characteristic of a vertical cavity structure.

What is claimed is:

1. A method for fabricating a $Al_xGa_yIn_zN$ structure, comprising the steps of:
   attaching a host substrate to a first mirror stack;
   fabricating a $Al_xGa_yIn_zN$ structure on a sacrificial growth substrate;
   creating a wafer bond interface;
   removing the sacrificial growth substrate by laser melting; and
   depositing electrical contacts to the $Al_xGa_yIn_zN$ structure.

2. A method for fabricating an $Al_xGa_yIn_zN$ structure, as defined in claim 1, wherein the step of removing the sacrificial growth substrate by laser melting comprises the steps of:
   repeating N times, where $N \geq 1$,
      growing a sacrificial layer, having a decomposition temperature, between the $Al_xGa_yIn_zN$ structure and the sacrificial growth substrate, and
      adjoining a stopper layer having a higher decomposition temperature than the sacrificial layer; and
   applying a laser at a selected laser wavelength, wherein the sacrificial growth substrate is transparent to the laser wavelength.

3. A method for fabricating an $Al_xGa_yIn_zN$ structure, as defined in claim 2, wherein the N sacrificial layers have a thickness such that the layer is decomposed.

4. A method for fabricating an $Al_xGa_yIn_zN$ structure, as defined in claim 3, further comprising the step of etching the N stopper layers.

5. A method for fabricating an $Al_xGa_yIn_zN$ structure, as defined in claim 2, wherein the sacrificial layer is gallium nitride and the stopper layer is $Al_xGa_yIn_zN$.

6. A method for fabricating an $Al_xGa_yIn_zN$ structure, as defined in claim 1, wherein the step of removing the sacrificial growth substrate by laser melting comprises the steps of:
   repeating N times, where $N \geq 1$,
      growing a sacrificial layer between the $Al_xGa_yIn_zN$ structure and the sacrificial growth substrate, and
      adjoining a stopper layer; and
   applying a laser at the selected laser wavelength, wherein the stopper layer has an absorption level at the selected laser wavelength and the sacrificial substrate is transparent to the selected laser wavelength.

7. A method for fabricating an $Al_xGa_yIn_zN$ structure, as defined in claim 6, wherein the N sacrificial layers have a thickness such that the layer is decomposed.

8. A method for fabricating an $Al_xGa_yIn_zN$ structure, as defined in claim 7, further comprising the step of etching the N stopper layers.

9. A method for fabricating an $Al_xGa_yIn_zN$ structure, as defined in claim 6, wherein the sacrificial layer is gallium nitride and the stopper layer is $Al_xGa_yIn_zN$.

10. A method for fabricating a $Al_xGa_yIn_zN$ structure comprising the steps of:
    fabricating a $Al_xGa_yIn_zN$ structure to a sacrificial growth substrate;
    depositing a first mirror stack on top of a $Al_xGa_yIn_zN$ structure;
    wafer bonding a host substrate to the first mirror stack to create a wafer bond interface;
    removing the sacrificial growth substrate by laser melting; and
    depositing electrical contacts to the $Al_xGa_yIn_zN$ structure.

11. A method for fabricating an $Al_xGa_yIn_zN$ structure, as defined in claim 10, wherein the step of removing the sacrificial growth substrate by laser melting comprises the steps of:
    repeating N times, where $N \geq 1$,
       growing a sacrificial layer, having a decomposition temperature, between the $Al_xGa_yIn_zN$ structure and the sacrificial growth substrate, and
       adjoining a stopper layer having a higher decomposition temperature than the sacrificial layer; and
    applying a laser at a selected wavelength, wherein the sacrificial substrate is transparent to the laser wavelength.

12. A method for fabricating an $Al_xGa_yIn_zN$ structure, as defined in claim 11, wherein the N sacrificial layers have a thickness such that the layer is decomposed.

13. A method for fabricating an $Al_xGa_yIn_zN$ structure, as defined in claim 12, further comprising the step of etching the N stopper layers.

14. A method for fabricating an $Al_xGa_yIn_zN$ structure, as defined in claim 11, wherein the sacrificial layer is gallium nitride and the stopper layer is $Al_xGa_yIn_zN$.

15. A method for fabricating an $Al_xGa_yIn_zN$ structure, as defined in claim 10, wherein the step of removing the sacrificial growth substrate by laser melting comprises the steps of:
    repeating N times, where $N \geq 1$,
       growing a sacrificial layer between the $Al_xGa_yIn_zN$ structure and the sacrificial substrate, and
       adjoining a stopper layer; and
    applying a laser with a selected laser wavelength, wherein the stopper layer has an absorption level at the selected wavelength and the sacrificial growth substrate is transparent to the laser wavelength.

16. A method for fabricating an $Al_xGa_yIn_zN$ structure, as defined in claim 15, wherein the N sacrificial layers have a thickness such that the layer is decomposed.

17. A method for fabricating an $Al_xGa_yIn_zN$ structure, as defined in claim 16, further comprising the step of etching the N stopper layers.

18. A method for fabricating an $Al_xGa_yIn_zN$ structure, as defined in claim 15, wherein the sacrificial layer is gallium nitride and the stopper layer is $Al_xGa_yIn_zN$.

* * * * *